United States Patent [19]

Canepa

[11] Patent Number: 5,142,495
[45] Date of Patent: Aug. 25, 1992

[54] VARIABLE LOAD FOR MARGIN MODE

[75] Inventor: George R. Canepa, Folsom, Calif.

[73] Assignee: Intel Corporation, Santa Clara, Calif.

[21] Appl. No.: 321,887

[22] Filed: Mar. 10, 1989

[51] Int. Cl.$^5$ .................. G11C 7/00; G11C 11/413; G11C 29/00

[52] U.S. Cl. .................. 365/189.09; 365/201; 365/104; 365/185; 365/210; 371/21.4

[58] Field of Search .............. 365/210, 207, 208, 185, 365/104, 210, 189.09, 218; 371/21.4

[56] References Cited

U.S. PATENT DOCUMENTS

| 4,386,419 | 5/1983 | Yamamoto | 365/190 |
| 4,612,630 | 9/1986 | Rosier | 365/201 |
| 4,644,196 | 2/1987 | Flannagan et al. | 365/190 X |
| 4,760,561 | 7/1988 | Yamamoto et al. | 365/154 X |
| 4,780,750 | 10/1988 | Nolan et al. | 365/185 |
| 4,809,231 | 2/1989 | Shannon et al. | 371/21.4 |
| 4,841,482 | 6/1989 | Kreifels et al. | 365/201 |
| 4,903,265 | 2/1990 | Shannon et al. | 371/21.4 |

FOREIGN PATENT DOCUMENTS 56-148792  11/1981  Japan ................ 365/201

Primary Examiner—Alyssa H. Bowler
Attorney, Agent, or Firm—Blakely, Sokoloff, Taylor & Zafman

[57] ABSTRACT

An improvement in the margining circuit wherein a variable load is provided to a column of EPROM cells. A plurality of parallel transistors are coupled as the load and by controlling the number of transistors which are turned on, the voltage to the column can be adjusted, effectively adjusting the current to the cells.

7 Claims, 1 Drawing Sheet

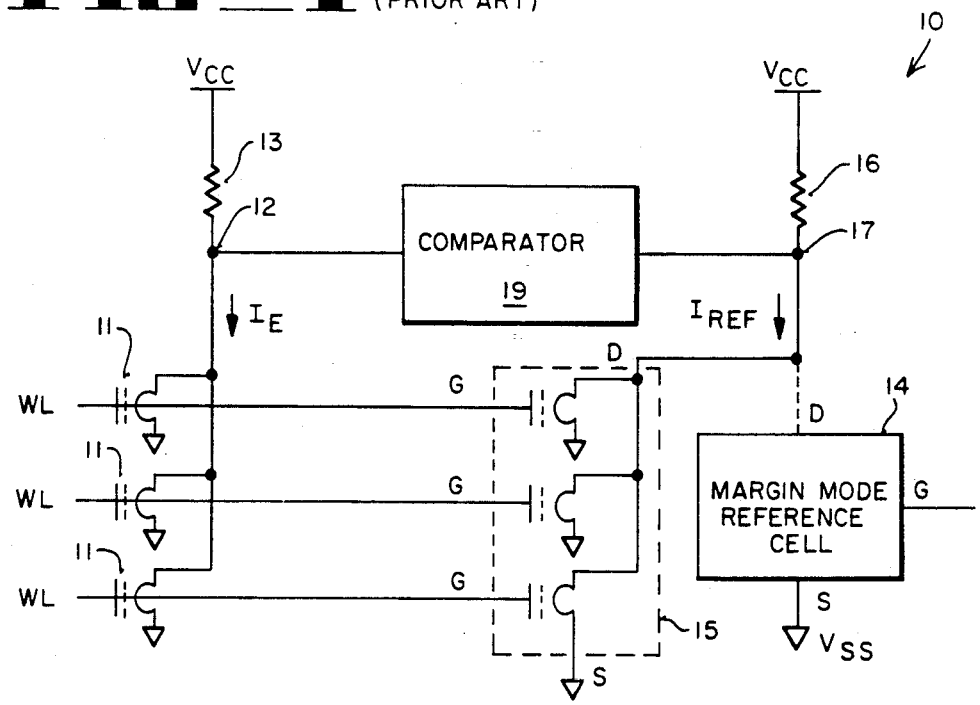
FIG_1 (PRIOR ART)
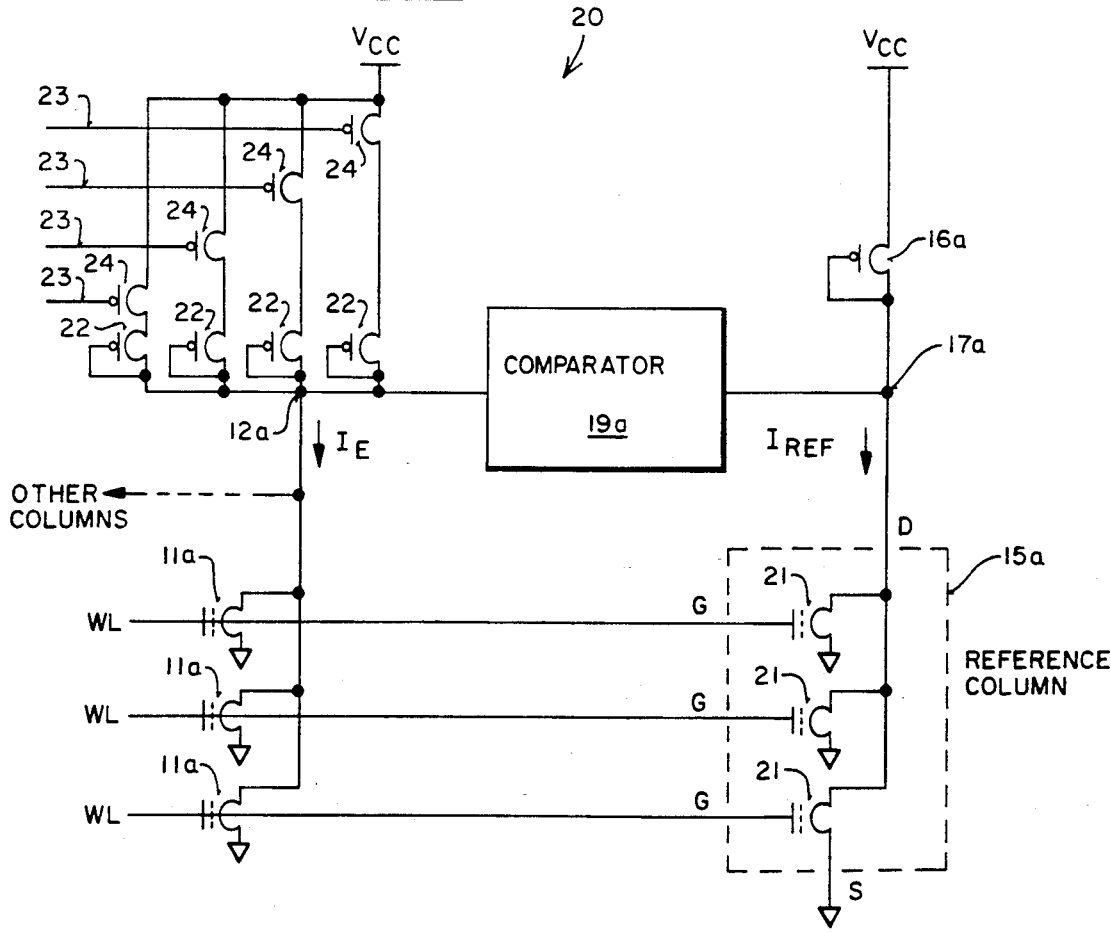
FIG_2

VARIABLE LOAD FOR MARGIN MODE

BACKGROUND OF THE INVENTION

1. Field of the invention

This invention relates to the field of metal-oxide-semiconductor (MOS) memory devices having floating gates and more specifically, to margining of erasable programmable read-only memories (EPROMs).

2. Prior art

The most commonly used EPROM cell has an electrically floating gate which is completely surrounded by insulation and generally disposed between a source and drain regions formed in a silicon substrate. The formation of various EPROM cells are well-known in the prior art. Avalanche injection was used in the earlier EPROM devices, while later versions of EPROMs used channel injection for charging the floating gate. Examples of EPROMs are described in U.S. Pat. Nos. 3,660,819; 4,142,926; 4,114,255; and 4,412,310.

EPROM memories are most often removed from their printed circuit boards for both erasing and programming. A special programming device is used for programming the cells after the cells have been erased. During programming, electrons are transferred to the floating gate making the cells less conductive.

Another floating gate memory is an electrically erasable programmable read-only memory (EEPROM). EEPROMs are typically programmed and erased while installed in the same circuit, such as a printed circuit board, used for reading data from the memory. Examples of EEPROMs are described in U.S. Pat. Nos. 4,203,158; 4,099,196; and 4,460,982.

Electrically erasing some floating gate devices gives rise to a serious problem, specifically undererasing and overerasing. During an erasing sequence some of the cells may not be completely erased, leaving those cells still in a programmed state. Conversely, too much charge can be removed, making the device "depletion-like". Cells are typically tested (verified) after being erased to verify that the floating gate is erased properly.

Similarly in an EPROM, processing variations can cause certain bits in the array to not conduct sufficient current to be properly detected as an erased bit or to seriously delay the detection as an erased bit beyond the specified access time for the chip.

In order to test the memory device, the device is placed into what is typically referred to as a margin mode. This margin mode will allow the detection of the low current bits so that this condition can be repaired through redundancy or the part discarded. A special margining circuit, which is usually "on-chip", is used to provide predetermined margining voltages for taking voltage and/or current readings of the erased cell(s). The margining voltage is used as a reference voltage to make a comparison with the voltage of the tested cell to determine if the cell adequately meets the predetermined margin point or level. Typically, this margin voltage is provided for the purpose of determing a margin current which is a ratio (or percentage) of the normal read current. An example of a floating gate margining is described in a U.S. Pat. No. 4,875,188, issued Oct. 17, 1989 entitled Voltage Margining Circuit For Flash Eprom.

SUMMARY OF THE INVENTION

An improvement in a floating gate integrated circuit memory, wherein a variable load is used to control a current to a column of memory cells during margining. A plurality of load transistors are arranged in parallel to function as a load for a column of EPROM cells. The voltage drop across the cells of the column during margin mode is changed from the voltage drop across the cells during normal read operation by controlling the number of load transistors which are turned on during the two modes. The activation of the load transistors can be controlled by programming if desired to make the load adjustable. This method of margining uses minimum testing time and is suited to a production environment.

BRIEF DESCRIPTION OF THE DRAWINGS

FIG. 1 is a circuit schematic diagram of a prior art margining circuit.

FIG. 2 is a circuit schematic diagram of a margining circuit of the present invention.

DETAILED DESCRIPTION OF THE PRESENT INVENTION

A margining circuit using a variable load for a floating gate memory is described. In the following description, numerous specific details, such as specific circuit components, memory device, etc., are set forth in order to provide a thorough understanding of the present invention. However, it will be obvious to one skilled in the art that the present invention may be practiced without these specific details. In other instances, well-known circuits have not been described in detail in order not to unnecessarily obscure the present invention.

Referring to FIG. 1, a prior art margining circuit 10 is shown. A plurality of floating gate memory cells 11, which are arranged having their drains coupled together in a column, are shown comprising one leg of circuit 10. Although three cells 11 are shown, the actual number is a design choice. The drains of cells 11 are coupled to node 12 and this node 12 is coupled to a voltage potential, such as Vcc, through a load device 13. In FIG. 1, the load device 13 is shown as a resistor. The gate of each of the memory cells is coupled to a respective decoded word line.

A second leg of circuit 10 is a reference leg comprised of a reference column of cells 15 and a load device 16. Column of cells 15 is used during normal read operation. When margin mode is to be entered into, a margin mode reference cell 14 is switched in in place of cells 15. The switching in is achieved at node 17. Reference cell 14 is coupled between node 17 and Vss, which in this instance is ground. The load device 16, shown as a resistor, is coupled between node 17 and a voltage, such as Vcc. Reference cell 14 can be comprised of a variety of devices for providing a stable margining reference, including a single memory cell, a plurality of cells or a reference circuit. However, functionally, reference cell 14 can be represented as a single cell having a source, drain, and a gate, which is how it is represented in FIG. 1.

Once cells 11 have been erased, margin mode is activated to measure the erased current of the cells 11. Current $I_E$ is the erased current of the column of cells 11. When margin mode is activated, a reference current $I_{REF}$ flows through the reference leg. This reference current is typically stable and is independent of process and temperature variations. A comparator 19 is coupled to nodes 12 and 17 to measure the voltage at nodes 12 and 17 to determine the current in each leg. It is appreciated that the gate of the reference cell 15 can be driven by different voltages, so that various values of $I_{REF}$ can be obtained. The comparator compares the current of the column $I_E$ to the reference current $I_{REF}$ and determines if $I_E$ is out of tolerance. During normal operation, cells 15 are switched in and the current $I_{REF}$ will be of a different value such that the voltage at node 17 will be different than that value in margin mode.

In most instances when $I_E$ is compared to $I_{REF}$, a ratio between the two currents already exists. This ratio is set by the load ratios used during normal reading operation. For example $I_E$ may be 10 microamperes (uA), while $I_{REF}$ is forced to a value of 30 uA to trip the comparator 19, for a ratio of 1 to 3. If this ratio needs to be changed, the gate drive to the reference cell is changed.

Referring to FIG. 2, a margining circuit 20 of the present invention is shown. Those elements in FIG. 2 which are equivalent to the elements of FIG. 1 are shown having the same reference numeral, but with a suffix "a" appended thereto. Again, a plurality of floating gate cells 11a are coupled as a column to node 12a. The reference leg is comprised of a reference column of cell 15a and load 16a. A comparator 19a is coupled to nodes 12a and 17a. In FIG. 2, load 16a is shown as a p-channel transistor, because circuit 20 is shown using complementary metal-oxide semiconductor (CMOS) technology. Further, reference cell 15a is shown comprised of a plurality of floating gate memory cells, wherein the gate of each reference memory cell 21 is coupled to a respective word line of a corresponding memory cell 11a.

The prior art load 13 of FIG. 1 has now been replaced with a variable load of the present invention. A plurality of load devices 22 are coupled in parallel between the high voltage and node 12a. Each load device 22 is coupled in series with a switching transistor 24 for activating its respective load 22. In circuit 20, each load 22 is comprised of a p-channel transistor, because CMOS technology is used in circuit 20. However it is appreciated that other variable load schemes can be readily adapted. Each transistor 24 has its gate coupled to be driven by a separate line 23. By placing a low signal state on a given line 23, corresponding transistor 24 is activated and places its respective load 22 in the circuit between Vcc and node 12a. The loading ratio will depend of the number of transistors 22 which are switched in. Each line 23 can be coupled so that it can be controlled by programming. The actual number of transistors 22 used in circuit 20 is a design choice.

It is to be appreciated that in the circuit 20 of the present invention, the reference current $I_{REF}$ remains constant, thereby providing a more steady and continuous reference value. Therefore, unlike the prior art circuit of FIG. 1, the reference current, and hence the voltage at node 17a, remains constant during normal read and margin modes. When a different ratio between the two nodes is required, the number of load devices switched into the circuit is changed, thereby changing the voltage at node 12a. Current $I_E$ remains substantially constant so that the voltage at node 12a becomes a function of the number of active loads 22 in the circuit. In the prior art circuit of FIG. 1, the significant error can be introduced when a reference is varied, the scheme of the present invention keeps the reference constant.

The load ratio during reading is fixed by the typical value of the read currents expected in the array. The modified ratio during the margin mode is fixed by the variation aroung this typical value that will still allow the part to function at its specified access time. A very low current is the array will significantly delay the access time.

Further, in the preferred embodiment, the number of active devices during margin mode is fixed. However, each of the switching transistors can be coupled so that programming signals can control the number of loads 22 which are to be switched in, making the margin mode reading at node 12a to be variable. Additionally, although the variable load is presented to a single column of cells in FIG. 1, a plurality of columns can be readily coupled together, which is typically the case of Y-decoded columns. The margining scheme of the present invention uses minimum testing time and is suited to a production environment.

I claim:

1. In an integrated circuit memory comprised of a plurality of memory cells, arranged in a row and column memory array, an improvement for providing a margining voltage to at least one of said memory cells comprising:

means for generating a reference current:

a plurality of load devices arranged in an array coupled to provide a load which establishes said margining voltage to said at least one of said memory cells wherein said margining voltage determines the margin current of at least one of said memory cells, wherein by changing the number of said load devices which are to be active, a change occurs in the ratio of said reference current to said margin current;

means for selecting a set of load devices wherein the number of said load devices in said set determines said load; and means for comparing said margin current of said at least one of said memory cells to said reference current.

2. The improvement defined by claim 1 wherein said integrated circuit memory is an erasable programmable read-only memory (EPROM).

3. The improvement defined by claim 2 wherein said load devices are transistors.

4. The improvement defined by claim 3 wherein said transistors are p-channel transistors.

5. In an integrated circuit memory comprised of a plurality of memory cells, arranged in a row and column memory array, wherein memory cells of each of said column are coupled together, an improvement for providing a margining voltage to memory cells of a selected column comprising:

means for generating a reference current:

a plurality of load transistors arranged in an array coupled to provide a load which establishes said margining voltage to said selected column wherein said margining voltage determines the margin current flowing through said selected column, wherein by changing the number of said load transistors which are to be active, a change occurs in the ratio of said reference current to said margin current;

means for selecting a set of said load transistors wherein the number of said load transistors in said set determines said load; and means for comparing said margin current to said reference current.

6. The improvement defined by claim 5 wherein said integrated circuit memory is an erasable programmable read-only memory (EPROM).

7. The improvement defined by claim 6 wherein said load transistors are p-channel devices.

* * * * *

UNITED STATES PATENT AND TRADEMARK OFFICE
CERTIFICATE OF CORRECTION

PATENT NO. : 5,142,495
DATED : August 25, 1992
INVENTOR(S) : George R. Canepa

It is certified that error appears in the above-indentified patent and that said Letters Patent is hereby corrected as shown below:

Column 3, line 62, after "Fig. 1 the", insert —reference current$^I$REF is changed when a differect ratio is desired. Because—

Signed and Sealed this

Tenth Day of October, 1995

Attest:

BRUCE LEHMAN

Attesting Officer

Commissioner of Patents and Trademarks